United States Patent [19]

Bito et al.

[11] Patent Number: 5,297,033
[45] Date of Patent: Mar. 22, 1994

[54] DATA PROCESSING METHOD IN NUCLEAR MAGNETIC RESONANCE MEASUREMENT

[75] Inventors: Yoshitaka Bito, Kokubunji; Kensuke Sekihara, Musashimurayama; Ryuichi Suzuki, Kokubunji, all of Japan

[73] Assignees: Hitachi, Ltd; Hitachi Medical Corp., both of Tokyo, Japan

[21] Appl. No.: 756,896

[22] Filed: Sep. 9, 1991

[30] Foreign Application Priority Data

Sep. 7, 1990 [JP] Japan .................................. 2-235543

[51] Int. Cl.$^5$ ........................ G06F 15/42; G01R 33/20
[52] U.S. Cl. ................................... 364/413.2; 324/309
[58] Field of Search ........................ 364/413.13, 413.16, 364/413.19, 413.2; 324/307, 309, 310, 311, 312

[56] References Cited

U.S. PATENT DOCUMENTS

| | | | |
|---|---|---|---|
| 4,973,111 | 11/1990 | Haacke et al. | 324/309 |
| 5,001,429 | 3/1991 | Constable et al. | 324/312 |
| 5,079,697 | 1/1992 | Chesler | 364/413.2 |
| 5,165,411 | 11/1992 | Miyamoto et al. | 128/653.2 |

FOREIGN PATENT DOCUMENTS 2-17039  1/1990  Japan .

OTHER PUBLICATIONS

"Modified Linear Prediction Modeling in Magnetic Resonance Imaging," Joel F. Marting and Charles F. Tirendi, *Journal of Magnetic Resonance*, vol. 82, 1989, pp. 392-399.

Primary Examiner—Roy N. Envall, Jr.
Assistant Examiner—A. Bodendorf
Attorney, Agent, or Firm—Antonelli, Terry, Stout & Kraus

[57] ABSTRACT

This invention relates to a data processing method for suppressing truncation artifacts mixed into two-dimensional images in nuclear magnetic resonance imaging. Two-dimensional measurement data arrays are obtained on a space frequency domain by the combination of phase encoding and a readout gradient magentic field, and a data position providing the greatest value of the one-dimensional data array constituting the two-dimensional measurement data array is obtained in the readout direction so as to estimate the origin of the space frequency axis in the readout direction. A high-pass filter using the estimated origin as a reference is applied to each one-dimensional data array, and data extrapolation is made for each one-dimensional data array to obtain a data array having an expanded region. Nuclear spin images are obtained by inverse Fourier transformation of these data arrays.

14 Claims, 3 Drawing Sheets

DATA PROCESSING METHOD IN NUCLEAR MAGNETIC RESONANCE MEASUREMENT

BACKGROUND OF THE INVENTION

This invention relates to an image reconstruction method in a nuclear magnetic resonance apparatus in a medical field.

Two-dimensional fast Fourier transformation (2D-FFT) has been used conventionally as a method of reconstructing two-dimensional images in a nuclear magnetic resonance apparatus but this method involves the problem that ringing referred to as "truncation artifacts" occurs because the number of measurement points is limited in this method. A method which applies a low-pass filter is known as the method of removing the truncation artifacts but this method is not free from the problem that resolution drops. Therefore, another method has been proposed which reduces the artifacts by extrapolating suitable data by linear prediction analysis. It is known, however, that when the linear prediction analysis is merely employed, the suppression effect of the artifacts is low.

As the reference which is the most approximate to the present invention, mention can be made of "Journal of Magnetic Resonance, Vol. 82, pp. 392-399 (1989). This method contemplates to reduce the truncation artifacts in an encoding direction, and after a linear high-pass filter is applied to data, data are extrapolated by effecting linear prediction analysis.

SUMMARY OF THE INVENTION

Problems with MRI using two-dimensional Fourier transformation include the problem of truncation artifacts resulting from insufficiency of the number of counts in a phase encoding direction and the problem of the aritfacts resulting from insufficiency of data in a readout direction, that is, truncation of the readout time. It has been found out that even when the last-mentioned technique among the reference described above is as such applied to the suppression of the truncation artifacts in this readout direction, its effect is not high. For, an accurate position of an origin of a space frequency domain is not known on data arrays in the readout direction collected by sampling and hence, high-pass filtering cannot be made correctly. This holds true not only of the two-dimensional MRI but also of nuclear magnetic resonance measuring methods which collect data lined up on a space frequency axis under the application of a readout gradient. In other words, when the method of suppressing the truncation artifacts of the prior art technique described above is applied to nuclear magnetic resonance measuring methods in which measurement data arrays lined up on a time axis represent data of a space frequency dimension, the effect is likely to be insufficient because the position of the origin of the space frequency domain is indefinite.

It is therefore an object of the present invention to provide a data processing method of a nuclear magnetic resonance apparatus which can effectively reduce truncation artifacts.

It is another object of the present invention to provide means which can reduce truncation artifacts in both readout and encoding directions.

It is still another object of the present invention to provide a method of suppressing truncation artifacts which can shorten the processing time of linear predication analysis.

The data processing method in accordance with the present invention comprises the steps of measuring nuclear magnetic resonance signals by a nuclear magnetic resonance measuring method in which measurement data arrays lined up on a time axis represent data of a space frequency dimension, and obtaining discrete measurement data arrays lined up in a limited first region on a space frequency axis in a certain direction; determining a position of a point providing the greatest value of the measurement data arrays and using it as the origin of the space frequency axis described above; applying a high-pass filter using this origin as a reference to the discrete measurement data arrays; effecting extrapolation of the data arrays, to which the high-pass filter is applied, by linear prediction analysis; and obtaining data arrays of a second region beyond the first region described above. The space domain distribution of the nuclear magnetic resonance signals is obtained by the use of the estimated measurement data whose region width is thus expanded by extrapolation. Typically, a reverse filter of the high-pass filter described above is applied to the data arrays whose region width is expanded by linear prediction analysis and then inverse Fourier transformation is effected.

The step of applying the reverse filter to the data array whose region width is expanded need not be conducted throughout the full range of the data array but may be effected for those data which exist outside the first region added by extrapolation. In other words, expansion of the measurement data can be completed by using the original measurement data before the application of the high-pass filter as the data in the first region, and joining the data array, which is extrapolated and subjected to reverse filtering, to the original measurement data array.

According to data processing described above, correct filtering processing can be conducted for the measurement data array even if the position of the origin of the space frequency axis deviates due to the change of measuring conditions, and extrapolation can be made highly accurately. Accordingly, suppression of the truncation artifacts can be made effectively.

A typical embodiment of the present invention applies the data processing described above to nuclear magnetic resonance imaging by the 2DFT method. In other words, two-dimensional measurement data arrays lined up in matrix inside a rectangular region in a space frequency domain are obtained by the measurement of nuclear magnetic resonance signals by the combination of phase encoding and a readout gradient, the position of data providing the greatest value for one dimensional measurement data array in the readout direction forming this two-dimensional measurement data array is determined and is used as the origin of the space frequency axis in the readout direction, a high-pass filter using this origin as a reference is applied to each measurement data array, and extrapolation is then made by linear prediction analysis for each of the data arrays to which the high-pass filter is applied. More definitely, inverse Fourier transformation is effected for the two-dimensional measurement data array inside the rectangular region in the phase encoding direction, the position of the origin of the space frequency is determined for each data array lined up in the readout direction for the resulting data arrays and then high-pass filtering is carried out. Extrapolation of each data array, which is filtered, is made by linear prediction analysis and the data arrays whose region is expanded in the readout direction are thus obtained. A reverse filter of the high-pass filter described above is applied to the data arrays and inverse Fourier transformation is effected in the readout direction. In this manner, a nuclear spin image from which truncation artifacts in the readout direction are removed can be obtained.

If extrapolation is necessary also in the phase encoding direction, Fourier transformation in the phase encoding direction and inverse Fourier transformation in the readout direction are carried out for the data arrays whose region is expanded in the readout direction, and high-pass filtering and data extrapolation by the linear prediction analysis are likewise carried out for each data array of the resulting two-dimensional data arrays in the phase encoding direction. Reverse filtering of the high-pass filter is then applied to the data arrays, whose region is thus expanded, and thereafter inverse Fourier transformation is made in the phase encoding direction. There can thus be obtained a nuclear spin image from which truncation artifacts are removed in two directions. It is also possible to first carry out extrapolation in the phase encoding direction and then to make extrapolation in the readout direction. When either sequence is employed, it is preferred to effect in advance the inverse Fourier transformation in one direction before data extrapolation is made in the other direction, if such data extrapolation is made.

When data expansion is made by extrapolation in one direction of the measurement data array on such a two-dimensional space frequency domain, it is possible to use the mean position of the data positions providing the greatest values of a plurality of data arrays as a common origin without using the data position providing the greatest value as the origin for each data array, and to apply high-pass filter to the common origin.

DESCRIPTION OF THE PREFERRED EMBODIMENTS

Hereinafter, an embodiment of the present invention will be described with reference to the accompanying drawings.

Figure 3:
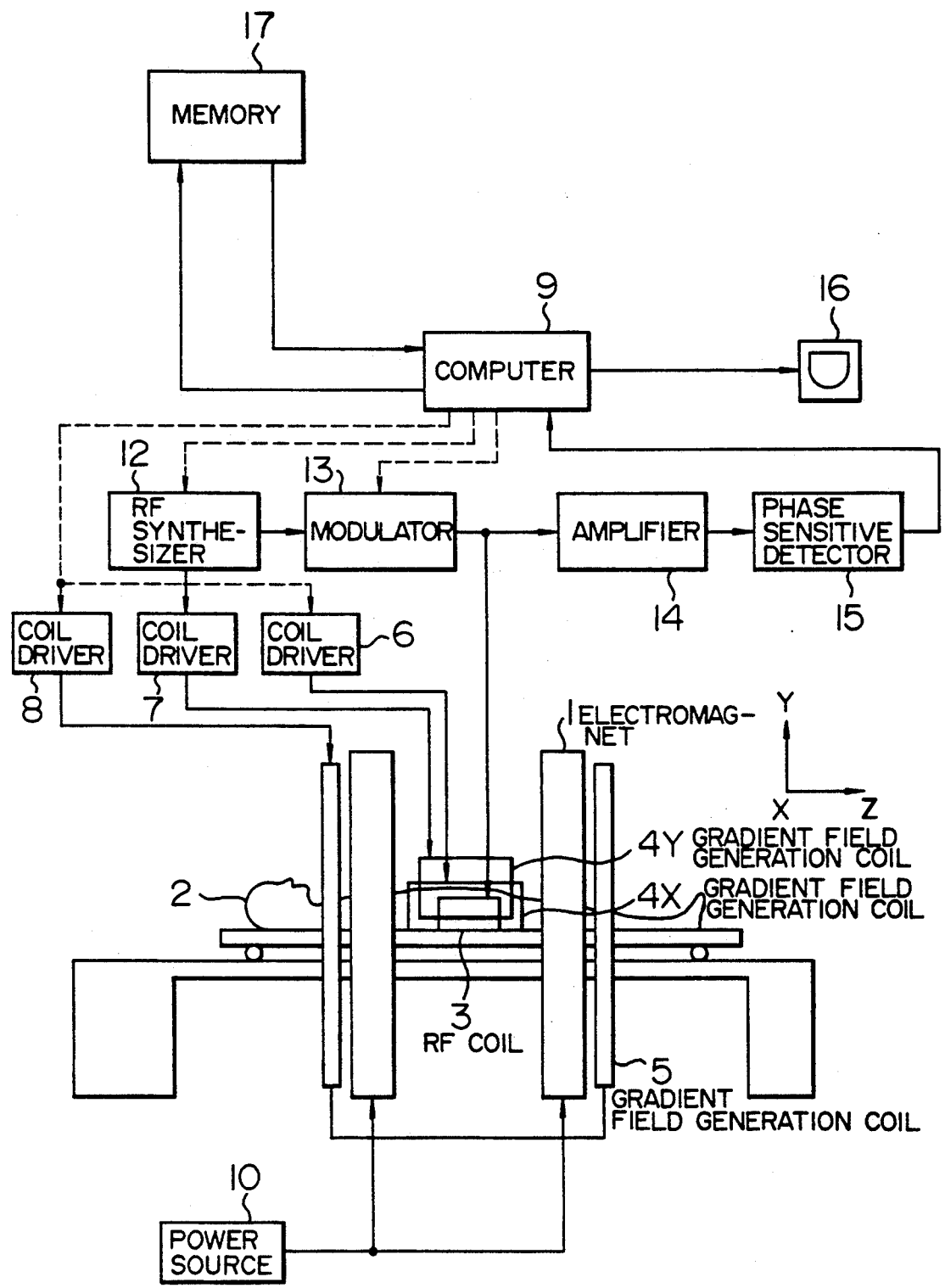
FIG. 3 is a block diagram showing a measuring apparatus used in the embodiment of the present invention.

FIG. 3 is a schematic structural view of an inspection apparatus using a nuclear magnetic resonance apparatus (hereinafter referred to merely as the "inspection apparatus") in accordance with an embodiment of the present invention.

In FIG. 3, reference numeral 3 denotes an electromagnet for generating a static magnetic field Ho; 2 is an object of inspection; 3 is an RF (Radio Frequency) coil for generating an RF magnetic field and at the same time, for detecting signals generated from the object 2; and 4x, 4y and 5 are gradient coils for generating gradient magnetic fields in X-, Y- and Z-directions, respectively. A circular coil which is wired in such a manner that currents flow therethrough in mutually opposite directions is used as the gradient coil 5. Reference numerals 6, 7 and 8 denote coil driving devices for supplying the currents to the gradient coils 4x, 4y and 5, respectively. Reference numeral 9 denotes a computer and reference numeral 10 does a power supply for the electromagnet 1 for generating the static magnetic field 1.

Next, the operation of this inspection apparatus will be outlined broadly.

The RF magnetic field for exciting a nuclear spin of the object 2 is generated by wave-shaping and power-amplifying the radio frequency wave generated by an RF synthesizer 12, by a modulator 13 and supplying the current to the coil 3. The signal from the object 2 is received by the RF coil 2, is passed through an amplifier 14, is detected by a phase sensitive detector 15 and is thereafter inputted to the computer 9. After processing the signal, the computer 9 displays images, etc, corresponding to the density distribution of the nuclear spin or its relaxation time distribution on a CRT display 16. Reference numeral 17 denotes a memory for storing data during computation or final data. To practise the present invention in such an apparatus, a sequence such as shown in FIG. 4 is used, for example.

Figure 4:
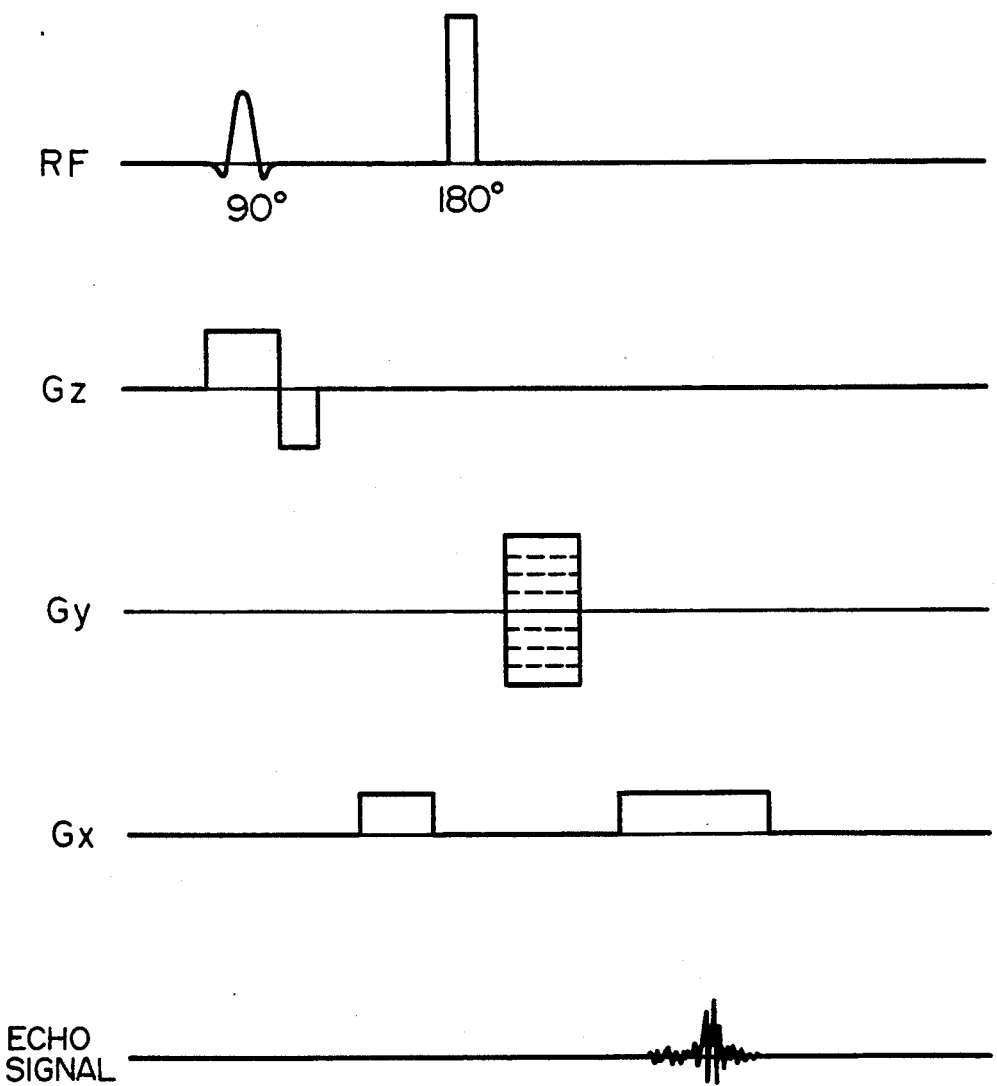
FIG. 4 is a waveform diagram showing a nuclear magnetic resonance measuring sequence in the embodiment of the present invention.

FIG. 4 shows a typical example of the measuring sequences for a 2DFT method. To begin with, a 90° RF pulse (radio frequency magnetic field) pulse is applied with the application of a gradient magnetic field pulse in the Z direction to excite a magnetization inside a slice at a certain position perpendicular to the Z axis. Next, the magnetization is reversed by a 180° RF pulse so as to generate an echo. However, an echo signal is sampled and measured under the state in which the gradient magnetic field Gx in the X direction (which will be referred to as a "readout gradient") is impressed. A gradient magnetic field Gx for dephasing once the spin phase in the X direction is applied for a predetermined time between the 90° RF pusle and the 180° RF pulse lest any error of the peak of the echo occurs due to the application of this readout gradient. Before the echo signal is measured, a phase encoding gradient Gy for encoding data of a position in the Y direction to the phase of the spin is applied. This measurement is repeated $N_0$ times while changing in $N_0$ ways the value of a gradient-time product of the phase encoding gradient in accordance with a program. Dash line of Gy in FIG. 4 represents the amplitude of Gy at this repetition. If the number of sampling during the measuring time is $M_0$, $M_0 \times N_0$ dimensional measurement data arrays can be obtained after the repetition of such measurements.

Figure 1:
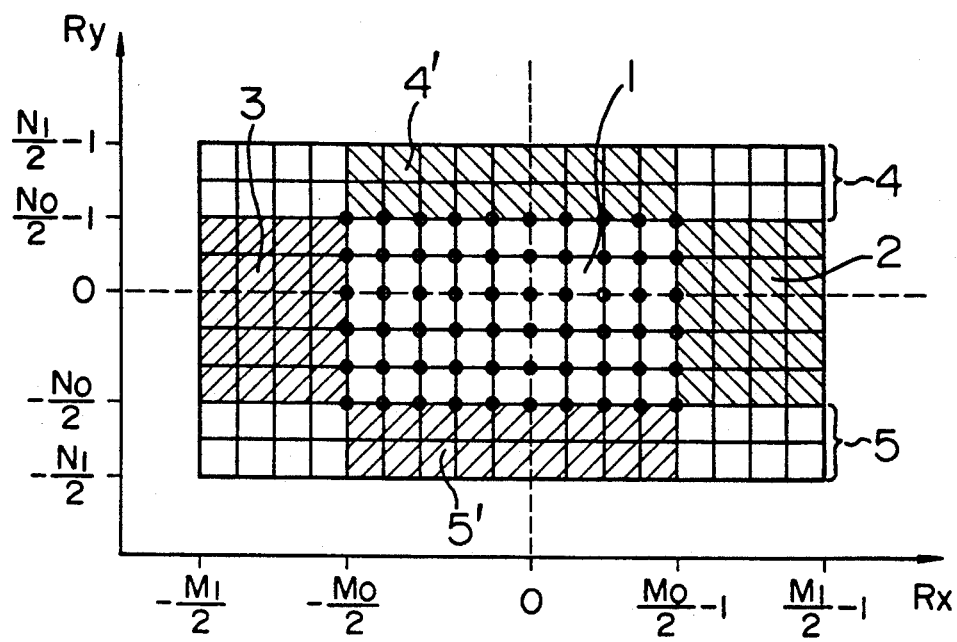
FIG. 1 is a conceptual view showing a region of a dimensional measurement data array and a region of a data array which is extrapolated in one embodiment of the present invention.

The data array obtained by such a sequence is such as a region 1 in FIG. 1. This data array will be labelled $F(k_x, k_y)$. Here, $k_x$ and $k_y$ represent space frequencies dispersed in the readout and encoding directions, and assume the values $k_x = -M_0/2, \ldots, M_0/2-1$, $k_y = -N_0/2, \ldots, N_0/2-1$, respectively. $M_0$ and No represent the numbers of data in the readout and encoding directions, respectively.

In other words, the measurement data arrays are lined up in matrix on a $(k_x, k_y)$ domain.

As to the readout direction, however, the origin of the space frequency $k_x$ does not always coincide with the center position of the time axis of each data array depending on two application/erasing timings shown in FIG. 4 and on the timing of data sampling.

Now, the presen tinvention is applied to such a data array in the following way.

To begin with, a method of extrapolating the data in the readout direction will be explained.

First, $F(k_x, k_y)$ is subjected to discrete inverse Fourier transformation for $k_y$ to obtain $F_x(k_x, y)$.

Next, the origin $C(y)$ of the space frequency axis ($k_x$ axis) is determined for each of a plurality of one-dimensional data arrays in the readout direction that constitute the data array $F_x(k_x, y)$ or in other words, for each of one-dimensional data arrays corresponding to each value of y. In this embodiment, the point $k_x$ that gives the greatest value of the absolute value of the function expressed by the one-dimensional data array, i.e. $|F_x(k_x)|$, or in other words, the peak position of the function $F_x(k_x)$ represented by solid line in FIG. 2, as the origin $C(y)$ of the $k_x$ axis. Since this function $F_x(k_x)$ is given by $M_0$ discrete data, the most simplified method of estimating the peak position would be the one that compares each value of the discrete data and searches the data having the greatest absolute value. Alternatively, the function $F_x(k_x)$ is estimated from the data providing the greatest absolute value and the data near the former by the least-square method so as to determine the peak position of the function.

When the origin $C(y)$ of the $k_x$ axis of each array of $F_x(k_x, y)$ is estimated, a high-pass filter $f(k_x)$ using these origins as the reference is applied to each data array and data extrapolation is made by a linear prediction analysis. Instead of using the method which uses $C(y)$ of each array as the origin of the space coordinates axis, it is also possible to calculate a mean value $C'(y)$ of the values $C(y)$ for each of a plurality of data arrays and to use this $C'(y)$ as a common origin of the space coordinates axis of these data arrays. Needless to say, it is further possible to calculate the mean value of the values $C(y)$ estimated for all the $N_0$ data arrays constituting the data array $F_x(k_x, y)$ and to use it as a common origin. Still alternatively, only the value $C(y)$ which remarkably deviates from others among a plurality of $C(y)$ values is judged as an error, and the mean value $C'(y)$ of the other $C(y)$ values can be used as the origin of the data array. These methods can prevent the estimation error of the origin due to admixture of irregular noise into the measurement data.

A high-pass filter of the following equation (1) or (2) is used as the high-pass filter using C or C' and they correspond to the difference and differentiation in the space domain, respectively.

$$f(k_x) = \exp(2\pi i(k_x-c)/N) - 1 \quad (1)$$

$$f(k_x) = k_x - c \quad (2)$$

where $\pi$ is the ratio of the circumference to the diameter, i is an imaginary unit and N is the number of terms of discrete Fourier transformation.

Figure 2:
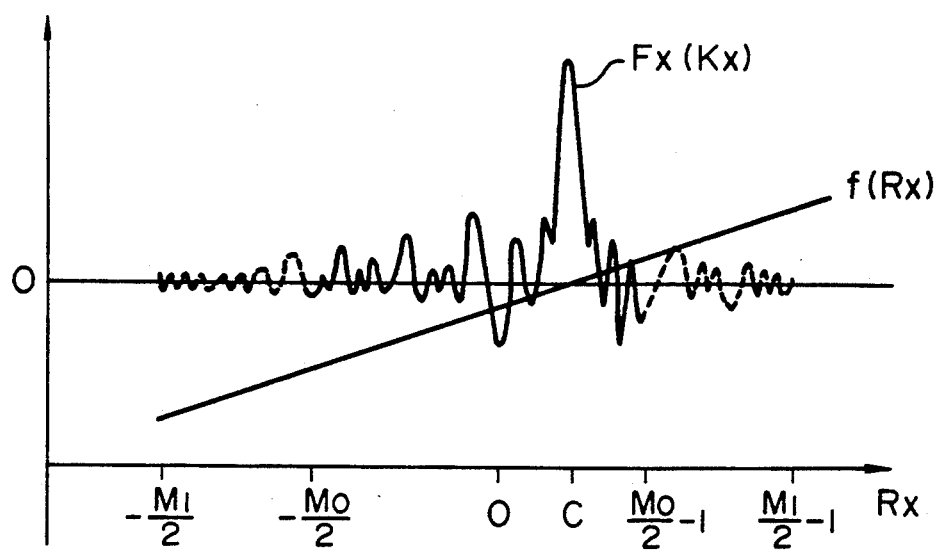
FIG. 2 is a conceptual view showing a method of applying a high-pass filter for extrapolation in the embodiment of the present invention.

FIG. 2 shows the function of the high-pass filter $f(k_x)$ shown in Eq. (2).

The high-pass filter $f(k_x)$ is applied to each of the data arrays $F_x(k_x, y)$ to obtain data arrays $G(k_x, y)$ expressed by the following equation:

$$G(k_x, y) = F_x(k_x, y)f(k_x) \quad (3)$$

Data extrapolation is made for each of the filtered data arrays $G(k_x, y)$ by a one-dimensional linear prediction analysis to estimate data between the regions $-M/2$ to $M/2-1$ from the data of the regions $-M_1/2$ and $-M_1/2-1$ of FIG. 2. Next, the one-dimensional linear prediction analysis will be explained in detail.

For simplicity, the one-dimensional data arrays are expressed as $g(k)$, $k=1, 2, \ldots, M$, and the following assumption is made for the data arrays:

$$g(k) = -\Sigma[g(k-i)x_i; i=1, p] + e(k) \quad (4)$$

Here, p is referred to as the number of dimensions of prediction, $x_i$ as prediction coefficients, and $e(k)$, as a prediction error. However, $\Sigma[;]$ has the following meaning:

$$\begin{aligned} \Sigma[g(k-i)x_i i &= 1, p] \\ &= g(k-1)x_i + g(k-2)x_i + \ldots + \\ &\quad g(k-p+1)x_{p-1} + g(k-p)x_p \end{aligned} \quad (5)$$

The prediction coefficient which minimizes the square norm of the prediction error is determined from the given data and the number of dimensions of prediction, and the data is extended to $g(k)$, $k=M+1, M+2, \ldots, N$ by effecting data extrapolation using the following equation (6):

$$g(k) = \Sigma[g(k-i)x_i; i=1, p], (M < k \leq N) \quad (6)$$

First, the following equation is established in order to obtain the prediction coefficient x:

$$Bx \approx -b \quad (7)$$

Here, B is a matrix of $(M-p)$ rows by p columns, and an element Bij is given by:

$$B_{ij} = g(M-i-j+1), (1 \leq i \leq M-p, 1 \leq j \leq p) \quad (8)$$

Symbol x is a p-dimension vector, b is an $(M-p)$-dimension vector and an element $b_1$ is given by:

$$b_i = g(M-i+1), (1 \leq i \leq M-p) \quad (9)$$

where $\approx$ means the least square norm. In other words, the vecotr x which makes $||Bx+b||$ minimum is determined.

As a method of solving this equation, a method using a normal equation and a singular value decomposition (hereinafter referred to as "SVD") will be explained.

First, the equation is changed to a normal equation as given below.

Assuming the Hermite conjugate of B as B*, each item is multiplied by B* from the first item. Then, $$B^*Bx = -B^*b \quad (10)$$

Assuming $A = B^*B$ and $a = B^*b$, then, $$Ax = -a \quad (11)$$

It is hereby noted that A forms an Hermite matrix of p rows by p columns. When SVP is used for this A, the following equation (12) is established because a certain unitary matrix of p rows by p columns and a certain real value diagonal matrix of p rows by p columns exist:

$$A = V\Lambda V^* \quad (12)$$

Accordingly, the following equation (13) is established.

$$x = -V\Lambda^{-1}V^*a \qquad (13)$$

where $\Lambda^{-1}$ represents that $\lambda_i^{-1}$ is made to correspond to each diagonal element $\lambda_i$ of $\Lambda$ (with the proviso that when $\lambda_i=0$, $\lambda_i^{-1}$ is zero).

Here, $\lambda_1$ corresponds to an eigen value of the matrix A and V does to an eigen vector of the matrix A. A householder method, a bi-section method and an inverse iterative method are known as the methods of determining the eigen value and the eigen vector. For detail, refer to the following literatures:

"Mathematical Method for Digital Computers, 2" John Wiley, (1967)

"Solving Least Squares problem" Prentice-hall, (1974)

"The Symmetric Eigenvalue Problem" Prentice-hall, (1980)

This method will be hereby explained briefly.

First, the householder method is applied to the p-row p-column Hermite matrix A, and the matrix A is multiplied by the unitary matrix from before and behind and converted to a triple diagonal matrix $\Delta$ having the same eigen values as the matrix A. In practice, the unitary matrix Q which makes the third element et seq of the first column zero is first multiplied from before. When the Hermite conjugate Q* of this unitary matrix is multiplied from behind, the third elements et seq of the first row become 0. Next, the same procedure is applied to a matrix obtained by deleting the first row and the first column, and the elements after the fourth row of the second column and the elements after the fourth column of the second row can be made zero. At this time, caution is taken so as not to change the first column of the first row. The triple diagnoal matrix $\Delta$ can thus be obtained by repeating this procedure. Q described above can be determined in the following way. The following equation (14) is assumed for the k-dimension vector and the k-dimension vector u is defined by the following equation (15):

$$\sigma = \begin{cases} v_2/|v_2|, & (|v_2| \neq 0), \\ 1, & (|v_2| = 0), \end{cases} \qquad (14)$$

$$s = -\sigma\Sigma[v_i^2; i = 2, k]$$

$$u_i = \begin{cases} 0, & (i = 1), \\ v_2 - s, & (i = 2), \\ v_i, & (3 \leq i \leq k), \end{cases} \qquad (15)$$

$$b = su_2$$

The k-row, k-column unitary matrix Q is defined as follows:

$$Q = \begin{cases} I + uu^*/b, & (b \neq 0), \\ I, & (b = 0) \end{cases} \qquad (16)$$

where I is the k-row, k-column unit matrix. At this time, the third element et seq of Qv become 0.

Next, the eigen values are calculated for the triple diagonal matrix $\Delta$ using the bi-section method. Considering that the matrix A is a non-negative definite matrix, the eigen value $\lambda_1$ satisfies the following relation:

$$0 \leq \lambda_i \leq R, \ (1 \leq i \leq p), \ R = \max[\Sigma(\Delta_{ij}; j=1, p]; 1 \leq i \leq p] \qquad (17)$$

This region is halved and the number of the eigen values contained therein is calculated. The same procedure is repeated for each of the regions and the eigen values having desired accuracy are obtained. As to the triple diagonal matrix, there is a simple method which determines the number of the eigen values contained. When an intermediate point of each region is a and $d_1$ is defined as listed below, the number of $d_1$ less than 0 is the number of the eigen values contained in the lower region (the region less than a):

$$\begin{aligned} d_1 &= \Delta_{11} - a, \\ d_i &= (\Delta_{ii} - |\Delta_{i,i+1}|^2/d_{i-1}) - a, \\ &(2 \leq i \leq p) \end{aligned} \qquad (18)$$

Next, the eigen vector is obtained by the inverse-iterative method. To obtain the eigen vector for the eigen value $\lambda_1$, an inverse-iterative calculation may be carried out as follows:

$$(A - \lambda_i)v_{(k+1)} = v_{(k)} \qquad (19)$$

The p-row p-column unitary matrix V can be obtained by normalizing the results and aligning them in the column vectors.

While $y_0$ is kept fixed, the one-dimensional linear prediction analysis described already is used for $G(k_x, k_y)$. In other words, the following equation (20) is used for the extrapolation of the data for the region 2 and the equation (21) is used for the extrapolation of the data for the region 3:

$$g(k) = G(k-1-M_0/2, y_0), \ (1 \leq k \leq M_0) \ M=M_0, \\ N=(M_1-M_0)/2 \qquad (20)$$

$$g(k) = G(-k+M_0/2, y_0), \ (1 \leq k \leq M_0), \ M=M_0, \\ N=(M_1-M_0)/2 \qquad (21)$$

When the extrapolation described above is made for all y, the expanded data arrays $G(k_x, y)$ can be obtained respectively.

Since the data $G_x(k_x, y)$ obtained in the manner described above have been passed through the high-pass filter $f(k_x)$, the reverse filter $1/f(k_x)$ is applied to each column so as to return the data to the original measured data. In this embodiment, the reverse filter is applied only to the outside data, among $G_x(k_x, y)$, which are extrapolated.

$$F_x(k_x, y) = G(k_x, y)/f(k_x), \ (-M_1 \leq k_x \leq -M_0-1, \\ M_0 \leq k_x \leq M_1-1) \qquad (22)$$

When $F_x(k_x, y)$ (the extrapolated portion) obtained by Eq. (22) and the data obtained by discrete inverse Fourier transformation of the original measurement data are joined together, $F_x(k_x, y)$ can be obtained within the range of $-M_1 \leq k_x \leq M_1-1$, $-N_0 \leq y \leq N_0-1$. In other words, as to the original measurement data array $F(k_x, y)$, too, the data of the rectangular region 1 obtained by the measurement are expanded and the data extending to the regions 1, 2 and 3 in FIG. 1 can be obtained substantially. Therefore, the expanded data array $F_x(k_x, y)$ is subjected to discrete inverse Fourier transformation for $k_x$, and there can thus be obtained an image H(x, y) whose truncation artifacts in the readout direction are reduced.

The algorithm of the embodiment described above can be summarized as follows.

(i) Discrete inverse Fourier transformation is effected in the encoding direction.

(ii) The point which gives the maximum value of the absolute value is defined as the origin in the readout direction.

(iii) Linear prediction analysis is made by applying the high-pass filter using the origin obtained in the item (ii) as the reference, the reverse filter is applied to the resulting outside data, and thereafter they are extrapolated to the original data.

(iv) Discrete inverse Fourier transformation is made in the readout direction.

In the embodiment described above, the origin in the $k_x$ direction is determined for $F_x(k_x, y)$ obtained by effecting inverse Fourier transformation in the $k_y$ direction for the two-dimensional data array $F(k_x, y)$ obtained by the measurement, and the high-pass filter is then applied to make extrapolation. Besides this method, it is also possible to determine the origin in the $k_x$ direction for the data array of the original $(k_x, k_y)$ space, and then to apply the high-pass filter for effecting extrapolation. In other words, when the reverse filter is applied to the data array after extrapolation, the data array $F(k_x, k_y)$ extending in the regions 1, 2 and 3 in FIG. 1 can be directly obtained. When the data array is subjected to two-dimensional inverse Fourier transformation in the $k_x$ and $k_y$ direction, an image $H(x, y)$ whose truncation artifacts are reduced in the readout direction can be obtained.

Furthermore, it is possible to employ a modified embodiment wherein the inverse Fourier transformation is effected for the extrapolated data arrays in place of the procedures of applying the reverse filter of the high-pass filter and then effecting the inverse Fourier transformation when extrapolation is completed in the embodiment described above. When the data array $G(k_x, y)$ is obtained by the extrapolation after applying the high-pass filter of Eq. (1), for example, $H'(x, y)$ is obtained by effecting the discrete inverse Fourier transformation to this expanded $G(k_x, y)$ for $k_x$.

Since $H'(x, y)$ is the data representing the difference value of the spin images in the readout direction (x direction), the cumulative calculation is sequentially conducted in the readout direction (x direction) to obtain the image $H(x, y)$.

The range of the extrapolation need not be the same number in the positive and negative directions of $k_x$. For example, the same and symmetric number, as to the positive and negative directions, of data extrapolation may be effected for the origin $C(y)$ of the $k_x$ axis obtained.

When the prediction coefficient is determined, the present invention can be practised by solving the following equation (23) by the use of a Levinson-Durabin method using an auto correlation function in place of Eq. (7). Here, the Levinson-Durbin method will be explained briefly.

Both sides of Eq. (4) are multiplied by $g(k-n)^E$ and $\Sigma$ is formally set from $-\infty$ to $+\infty$. Then, the following equation (23) can be obtained:

$$Ax = -a \tag{23}$$

Here, A is the Hermite matrix of the p-row and p-column and the element $A_{ij}$ is given as follows:

$$A_{ij} = R(i-j) \tag{24}$$

Here, R(n) is referred to as the self correlation function and is given by:

$$R(n) = \Sigma[g(k-n)^* g(k); k = -\infty, +\infty], \tag{25}$$
$$(-M + 1 \leq n \leq M - 1),$$
$$(\text{where } g(k) = 0, (k \leq 0, M + 1 \leq k))$$

where symbol * is a complex conjugate, x is a p-dimension vector and a is a p-dimension vector. The element $a_i$ is given by:

$$a_i = R(i), \, (1 \leq i \leq p) \tag{26}$$

For this equation, the following Levinson-Durbin recursive formula is established:

$$P_0 = R(0) \tag{27}$$

Next, the following calculation is repeated about $1 \leq m \leq p$:

$$\begin{aligned} x_{(m)m} &= -(R(m) + \Sigma[R(m-i)x_{(m-1)i}, i = 1, m-1])/P_{m-1} \\ P_m &= P_{m-1}(1 - |x_{(m)m}|^2) \\ x_{(m)i} &= x_{(m-1)i} + x_{(m)m}x_{(m-1)m-i}^*, \, (1 \leq i \leq m-1) \end{aligned} \tag{28}$$

There is thus obtained the following equation (20):

$$x_i = x_{(p)i}, \, (1 \leq i \leq p) \tag{29}$$

Though Eq. (7) uses all the data points to establish the equation, not all, but a certain large number, of data points may be used sufficiently. In other words, Eqs. (7), (8) and (9) may be changed to the following equations (7)', (8)' and (9)' by using M' which is smaller than the number of data M, respectively.

$$Bx \approx -b \tag{7'}$$

where B is a (M'-p)-row p-column matrix and an element $B_{ij}$ is given by:

$$B_{ij} = g(M-i-j+1), \, (1 \leq i \leq M'-p, \, 1 \leq j \leq p) \tag{8'}$$

Symbol X represents a p-dimension vector, b is an (M'-p)-dimension vector and the elements $b_i$ is given by:

$$b_i = g(M-i+1), \, (1 \leq i \leq M'-p) \tag{9'}$$

Though SVD is used as the method of solving Eq. (11), a Gauss-Jordan method or a modified Cholesky method may be used, as well. A Jacobi method or a QR method may be used for calculating the eigen value and the eigen vector is SVD.

As described above, various known methods can be used as the one-dimensional linear prediction analysis when the present invention is practised. The application of the present invention is not particularly limited to two-dimensional nuclear magnetic resonance imaging by the 2DFT method described in the embodiment given above. In other words, data arrays of limited regions are obtained by a nuclear magnetic resonance measuring method in which the measured data arrays lined up on the time axis mean the data of the space frequency dimension, the data position which provides the maximum value of the function generated by the data arrays is detected and used as the origin of the space frequency axis, and after the high-pass filter using this origin as the reference is applied to the data arrays, data extrapolation is effected by the one-dimensional linear prediction analysis. In this way, the correct high-pass filter can be applied and accuracy of data extrapolation by the linear prediction analysis becomes higher. Accordingly, the resulting truncated artifacts can be suppressed effectively even by the data arrays of limited regions or in other words, even by the use of the nuclear magnetic resonance measuring sequence capable of measuring only specific periods to avoid the limitation imposed on the full measuring time or the mixture of noise.

Next, as another example of the nuclear magnetic resonance two-dimensional imaging by the 2DFT method, a method which effects data extrapolation in both the readout and encoding directions will be explained. In other words, the following method is employed in order to obtain an iamge having reduced truncation artifacts in both the readout and encoding directions by extrapolating data to the regions 2, 3, 4 and 5 shown in FIG. 1 and then effecting image reconstruction.

First of all, the data array $F(k_x, k_y)$ shown in FIG. 1 is subjected to discrete inverse Fourier transformation having the number of terms $N_0$ for $k_y$ is expressed as $F_x(k_x, y)$, $k_x = -M_0/2, \ldots, M_0/2-1$, $y = -N_0/2, \ldots, N_0/2-1$. Then, the origin in the readout direction is estimated in the same way as in the embodiment described above and the high-pass filter is applied to the data arrays in the $k_x$ direction so as to make data extrapolation of the data arrays in the $k_x$ direction (regions 2 and 3). There can thus be obtained the data $F_x(k_x, y)$, $k_x = -M_1/2, \ldots, M_1/2-1$, $y = -N_0/2, \ldots, N_0/2-1$.

Discrete inverse Fourier transformation having the number of terms $N_0$ is made for $F_x(k_x, y)$ for y to return the data to the original data, thus obtaining the data $F(k_x, k_y)$, $k_x = -M_1/2, \ldots, M_1/2-1$, $k_x = -N_0/2, \ldots, N_0/2-1$.

Next, $F(k_x, k_y)$ is subjected to discrete inverse Fourier transformation having the number of terms $M_1$ for $k_x$, and the result is written as $F_y(x, k_y)$, $x = -M_1/2, \ldots, M_1/2-1$, $k_y = -N_0/2, \ldots, N_0/2-1$. Then, data extrapolation is made in the $k_y$ direction (regions 4 and 5) in the same way as in the $k_x$ direction to obtain data $F_y(x, k_y)$, $x = -M_1/2, \ldots, M_1/2-1$, $k_y = -N_1/2, \ldots, N_1/2-1$. Finally, $F_y(x, k_y)$ is subjected to discrete inverse Fourier transformation having the number of terms $N_1$ for $k_y$ to obtain an image $H(x, y)$.

The algorithm given above can be summarized as follows.

(I) Discrete inverse Fourier transformation is effected in the encoding direction.

(II) Data extrapolation is made in the readout direction while considering the origin in the readout direction in the same way as in the embodiment described already (the procedures (i) and (ii) of the foregoing embodiment).

(III) Discrete Fourier transformation is effected in the encoding direction so as to return the data to the original data.

(IV) Discrete inverse Fourier transformation is effected in the readout direction.

(V) Data extrapolation is effected in the encoding direction in the same way as in the method described above.

(VI) Discrete inverse Fourier transformation is effected in the encoding direction to obtain the image.

In the algorithm (III) described above, Forier transformation is effected for all the data arrays in the y direction. In practice, however, it is possible to effect Fourier transformation for only the portions for which data extrapolation is made and to use the original data $F(k_x, k_y)$ for the rest of the portions. In the algorithms (I) and (III) described above, Fourier transformation is made with the number of terms $N_0$, but Fourier transformation may be made with the number of terms $N_1$ in either case.

Furthermore, extrapolation in the encoding direction may be made before extrapolation in the readout direction is made. In other words, data extrapolation for 4' and 5' is first made for the measurement data arrays obtained for the region 1 in FIG. 1. Next, data extrapolation in the $k_x$ direction is made from the data extending to the regions 1, 4' and 5'. At this time, the estimation of the position of the origin of the $k_x$ axis by the detection of the peak position becomes necessary for each of the data arrays in the $N_1$ readout directions. Even when extrapolation in either direction is first made or when extrapolation in a certain direction is made, inverse Fourier transformation in the other direction is made, and data extrapolation is then made by the linear prediction analysis after the high-pass filter is applied to each of the one-dimensional data arrays. According to this method, data extrapolation in the two directions in the space frequency domain can be made accurately and the suppression of the truncation artifacts of the two-dimensional image can be executed effectively.

We claim:

1. A data processing method in nuclear magnetic resonance measurement, comprising the steps of:

measuring nuclear magnetic resonance signals by a nuclear magnetic resonance measuring method in which measurement data lined up on a time axis represent data of a space frequency dimension, and obtained discrete measurement data arrays lined up in a first region limited on a space frequency axis in a certain direction;

determining the position of a point providing the greatest value of a function represented by said measurement data arrays, and estimating the origin of said space frequency axis;

applying a high-pass filter using said origin as a reference to said measurement data arrays;

effecting data extrapolation to said data arrays, to which said high-pass filter is applied, by a one-dimensional linear prediction analysis, and estimating data arrays of a second region beyond said first region; and effecting inverse Fourier transformation for said data arrays of said second region and obtaining nuclear spin image data.

2. A data processing method in nuclear magnetic resonance measurement according to claim 1, wherein the estimation of said data arrays in said second region includes the step of applying a reverse filter of said high-pass filter to said data arrays obtained by extrapolation.

3. A data processing method in nuclear magnetic resonance measurement according to claim 1, wherein the estimation of said origin of said space frequency axis is made by comparing each data of said measurement data arrays and using the position of the data having the greatest absolute value as the position of said origin.

4. A data processing method in nuclear magnetic resonance measurement according to claim 1, wherein the estimation of said origin of said space frequency axis is made by detecting the peak position of the function represented by said measurement data arrays from a plurality of data inclusive of, and near, at least a data having the greatest absolute value, and using this peak position as said origin.

5. A data processing method in nuclear magnetic resonance measurement according to claim 1, wherein said high-pass filter is a high-pass filter on said space frequency axis corresponding to a differentiation or a difference on a space domain.

6. A data processing method in nuclear magnetic resonance measurement, comprising the steps of:
measuring nuclear magnetic resonance signals by a nuclear magnetic resonance measuring method in which measurement data arrays lined up on a time axis represent data of a space frequency domain, and obtaining discrete two-dimensional measurement data arrays lined up in matrix in a first rectangular region limited in first and second space frequency axis directions;
determining the position of a point providing the greatest value of a function represented by each of said one-dimensional data arrays for each of a plurality of said first-dimensional data arrays in said first space frequency direction, and estimating the origin of said first space frequency axis;
applying a high-pass filter using said origin as a reference to each of a plurality of said one-dimensional measurement data arrays;
effecting data extrapolation to each of a plurality of said one-dimensional data arrays, to which said high-pass filter is applied, by a one-dimensional linear prediction analysis, and estimating two-dimensional data arrays in a second rectangular region expanded in said first space frequency axis direction relative to said first rectangular region; and
effecting two-dimensional inverse Fourier transformation for said data arrays of said second rectangular region, and obtaining nuclear spin image data.

7. A data processing method in nuclear magnetic resonance measurement according to claim 6, wherein the estimation of said origin is effected individually for each of a plurality of said one-dimensional data arrays.

8. A data processing method in nuclear magnetic resonance measurement according to claim 6, wherein the estimation of said origin is made by determining a mean position of positions providing the greatest values of the functions of at least two of said one-dimensional data arrays among a plurality of said one-dimensional data arrays, and using this mean position as a common origin of said at least two one-dimensional data arrays.

9. A data processing method in nuclear magnetic resonance measurement, comprising the steps of:
measuring nuclear magnetic resonance signals by a nuclear magnetic resonance measuring method in which measurement data arrays lined up on a time axis represent data of a space frequency domain, and obtaining discrete two-dimensional measurement data arrays lined up in matrix in a first rectangular region limited in first and second space frequency axis directions;
determining the position of a point providing the greatest value of a function represented by each of said one-dimensional data arrays for each of a plurality of said first-dimensional data arrays in said first space frequency direction, and estimating the origin of said first space frequency axis;
applying a high-pass filter using said origin as a reference to each of a plurality of said one-dimensional measurement data arrays;
effecting data extrapolation to each of a plurality of said one-dimensional data arrays, to which said high-pass filter is applied, by a one-dimensional linear prediction analysis, and estimating two-dimensional data arrays in a second rectangular region expanded in said first space frequency axis direction relative to said first rectangular region;
effecting data extrapolation to each of a plurality of said one-dimensional data arrays in said second space frequency axis constituting said two-dimensional data arrays in said second rectangular region, by the one-dimensional linear prediction analysis, and estimating two-dimensional data arrays in a third rectangular region expanded in said second space frequency axis direction relative to said second rectangular region; and
effecting two-dimensional inverse Fourier transformation to said data arrays of said third rectangular region, and obtaining nuclear spin image data.

10. A data processing method in nuclear magnetic resonance measurement, comprising the steps of:
measuring nuclear magnetic resonance signals by a nuclear magnetic resonance measuring method in which measurement data arrays lined up on a time axis represent data of a space frequency domain, and obtaining discrete two-dimensional measurement data arrays lined up in matrix in a first rectangular region limited in first and second space frequency axis direction;
effecting inverse Fourier transformation for said two-dimensional measurement data arrays in said second space frequency axis direction;
determining the position of a point providing the greatest value of a function represented by each of a plurality of said one-dimensional data arrays in said first space frequency direction constituting said two-dimensional data arrays obtained by said inverse Fourier transformation, and estimating the origin of said first space frequency axis;
applying a high-pass filter using said origin as a reference to each of a plurality of said one-dimensional measurement data arrays;
effecting data extrapolation to each of a plurality of said one-dimensional data arrays, to which said high-pass filter is applied, by a one-dimensional linear prediction analysis, and estimating two-dimensional data arrays in a second rectangular region expanded in said first space frequency axis direction relative to said first rectangular region; and
effecting inverse Fourier transformation to said two-dimensional data arrays in said second rectangular regions in said first frequency axis direction, and obtaining nuclear spin image data.

11. A data processing method in nuclear magnetic resonance measurement according to claim 10, wherein the estimation of said origin is effected individually for each of a plurality of said one-dimensional data arrays.

12. A data processing method in nuclear magnetic resonance measurement according to claim 10, wherein the estimation of said origin is made by determining a mean position of positions providing the greatest values of the functions of at least two of said one-dimensional data arrays among a plurality of said one-dimensional data arrays, and using this mean position as a common origin of said at least two one-dimensional data arrays.

13. A data processing emthod in nuclear magnetic resonance measurement according to claim 10, wherein the estimation of said two-dimensional data in said second rectangular region is made by applying an inverse filter of said high-pass filter to each of said one-dimensional data arrays obtained by data extrapolation.

14. A data processing method in nuclear magnetic resonance measurement, comprising the steps of:
   measuring nuclear magnetic resonance signals by a nuclear magnetic resonance measuring method in which measurement data arrays lined up on a time axis represent data of a space frequency domain, and obtaining discrete two-dimensional measurement data arrays lined up in matrix in a first rectangular region limited in first and second space frequency axis directions;
   effecting inverse Fourier transformation for each of said two-dimensional measurement data arrays in said second space frequency axis direction;
   determining the position of a point providing, the greatest value of a function represented by each of a plurality of said one-dimensional data arrays in said first space frequency direction constituting said two-dimensional data arrays obtained by said inverse Fourier transformation, and estimating the origin of said first space frequency axis;
   applying a high-pass filter using said origin as a reference to each of a plurality of said one-dimensional measurement data arrays;
   effecting data extrapolation to each of a plurality of said one-dimensional data arrays, to which said high-pass filter is applied, by a one-dimensional linear prediction analysis;
   effecting inverse Fourier transformation for each of said two-dimensional data arrays in said second rectangular region in the direction of said first space frequency axis;
   effecting data prediction for each of a plurality of said one-dimensional data arrays in said second space frequency axis direction constituting said second two-dimensional data arrays obained by inverse Fourier transformation in said first space frequency axis, by the one-dimensional linear prediction analysis, and obtaining two-dimensional data arrays in a third rectangular region expanded in said second frequency axis direction relative to said second rectangular; and
   effecting inverse Fourier transformation for said data arrays in said third rectangular region in said second space frequency axis direction, and obtaining nuclear spin image data.

* * * * *